(12) United States Patent
Takamura

(10) Patent No.: US 6,879,007 B2
(45) Date of Patent: Apr. 12, 2005

(54) LOW VOLT/HIGH VOLT TRANSISTOR

(75) Inventor: Yoshiji Takamura, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/214,148

(22) Filed: Aug. 8, 2002

(65) Prior Publication Data

US 2004/0026750 A1 Feb. 12, 2004

(51) Int. Cl.$^7$ .................. H01L 29/76; H01L 29/94; H01L 31/062; H01L 31/113; H01L 31/119
(52) U.S. Cl. .................. 257/392; 257/387; 257/390; 257/391; 257/395; 438/217; 438/276; 438/289; 438/291
(58) Field of Search .................. 257/389, 390, 257/391, 392, 395; 438/217, 276, 289, 291

(56) References Cited

U.S. PATENT DOCUMENTS

| | | | |
|---|---|---|---|
| 5,795,803 A | 8/1998 | Takamura et al. | |
| 5,834,352 A * | 11/1998 | Choi | 438/275 |
| 5,847,432 A * | 12/1998 | Nozaki | 257/369 |
| 6,267,479 B1 | 7/2001 | Yamada et al. | |
| 6,455,386 B1 * | 9/2002 | Mirabel | 438/301 |
| 6,468,849 B1 * | 10/2002 | Effland et al. | 438/200 |
| 6,468,860 B1 * | 10/2002 | Polavarapu et al. | 438/257 |
| 6,541,321 B1 * | 4/2003 | Buller et al. | 438/197 |

FOREIGN PATENT DOCUMENTS

JP 2000-31292 A 1/2000

* cited by examiner

Primary Examiner—George Eckert
Assistant Examiner—Edgardo Ortiz
(74) Attorney, Agent, or Firm—Birch, Stewart, Kolasch & Birch, LLP

(57) ABSTRACT

A semiconductor device has at least one high-voltage and low-voltage transistor on a single substrate. The reliability of the high-voltage transistor is enhanced by performing a LDD implantation in only the high-voltage transistor prior to conducting an oxidation process to protect the substrate and gate electrode. After the oxidation process is performed, the low-voltage transistor is subjected to an LDD implantation process. The resultant semiconductor device provides a high-voltage transistor having a deeper LDD region junction depth than the low-voltage transistor, ensuring reliability and performance.

10 Claims, 3 Drawing Sheets

LOW VOLT/HIGH VOLT TRANSISTOR

BACKGROUND OF THE INVENTION

1. Field of the Invention

The invention relates to semiconductor devices having transistors operating with high and low voltages.

2. Description of Related Art

In conventional semiconductor devices having both high-voltage transistors (operation voltage of about 1.8–5.0 V with a thicker gate oxide) and low-voltage transistors (operation voltage of about 1.0–2.5 V with a thinner gate oxide) such as MOS transistors, a design goal has been to manufacture a device in which size is minimized and the number of heat processes used in manufacturing are limited, in order to avoid a short channel effect. However, although the reduced heat processes were good for the manufacture of low-voltage transistors, the reducing of heat processes led to the creation on the device of a high-voltage transistor that was less reliable for high-voltage operations. However, if the number heat processes were increased, then this would have a disadvantageous effect on the low-voltage transistor, causing diffusion effects in the low-voltage transistor that reduces its performance.

Thus, designers adopted light-doped drain (LDD) technologies, which added one or more additional drain layers or regions to the transistors, in an effort to reduce the electric field density in the vicinity of the drain. However, the effects of LDD implantation or LDD doping varied depending on whether or not the eventual transistor was to be a high-voltage or low-voltage transistor on the semiconductor device. For low-voltage transistors, characteristics such as higher impurity density and shallower junction depth were preferred. In contrast, high-voltage transistors require a low impurity density but deeper junction depth characteristics.

This created a tradeoff. Varying LDD regions created reliability degradation problems in both high and low-voltage transistors. Overcoming the reliability problems for the high-voltage transistors resulted in a need to diffuse, which required an increase in thermal processing, or an increase in the energy of ion implantations. However, this increase in ion implantation energy led to increases in junction depth of the LDD region in low-voltage transistors, which limited the transistor's performance due to poor short channel immunity.

In particular, and as will be described more fully below, the conventional method of manufacturing a semiconductor device was one direct reason for the above-noted problems. FIG. 1 illustrates a general method of forming a conventional semiconductor device. In particular, in Step S0.1 a thick gate oxide is formed for a high-voltage transistor by means of thermal oxidization. In Step S0.2 the thick gate oxide is removed at low-voltage transistor region. Then a thin gate oxide is formed there for low-voltage transistor region by thermal oxidization. In Step S1 the gate electrodes, and islands of the eventual NMOS and PMOS transistors are formed on a Si substrate. Thereafter in Step S2, oxidation processes or thermal processes are conducted in order to build-up oxide films to protect the Si substrate and the gate electrodes, in preparation for further doping processes to form the eventual high or low-voltage NMOS or PMOS transistors of a semiconductor device. After the formation of the gate electrode in Step S1 and the oxidation/thermal processes of Step S2 are completed, then the process of doping or ion implantation to form either the high or low-voltage transistor region is performed, where the islands (having been formed ahead of time) are doped or implanted with the LDD regions, n-type and p-type regions, and source/drain regions (Steps S3 and S4).

The problem with this conventional method is that the regions where the high-voltage transistors were to be formed could not diffuse LDD sufficiently, because the oxidation processes (Step S2) took place before the LDD doping processes in steps S3. Particularly, the junction depth of the high-voltage transistor was not sufficiently deep. Therefore, the LDD junction depths for both the high-voltage and low-voltage transistors were about equal, and the high-voltage transistor was subject to degraded reliability. Hence, overall device performance was reduced.

One effort to overcome this problem is described in Laid-Open Japanese Patent Publication No. 2000-31292. This patent describes a technology whereby the reliability of the high-voltage transistor is secured without degrading the characteristics of the low-voltage transistor by changing the structure of the LDD regions of the high-voltage transistor and the low-voltage transistor. In JP 2000-31292, the LDD structures of the low-voltage transistor and the high-voltage transistor are changed simply by changing the implantation conditions only.

However, in the most recent LSI processes, in which the thermal hysteresis is sufficiently low from the LDD implantation process performed after the oxidation process, it is difficult to form a smooth junction at the LDD end, and consequently it is difficult to ensure the reliability of the high-voltage transistor. Accordingly, LSI processes desire a method of forming a semiconductor device having high and low-voltage transistors that ensures the acceptable reliability and performance of the high-voltage transistor.

SUMMARY OF THE INVENTION

The invention, in part, provides a method of forming a semiconductor device having at least one high-voltage and low-voltage transistor on a single substrate that overcomes the above-noted deficiencies. In the method, reliability of the high-voltage transistor is enhanced by doping the high-voltage transistor with an LDD implantation process to form LDD regions thereon before conducting the oxidation processes to protect the substrate and gate electrode. After the oxidation process step is performed, then the low-voltage transistor is doped with the LDD implantation process. The resultant device provides a high-voltage transistor where the subsequent oxidation step provides a deep LDD region junction depth to ensure reliability, and provides a low-voltage transistor that is LDD-doped after the oxidation step to provide a shallower LDD region junction depth so as to maintain short channel effect immunity.

The invention, in part, pertains to each transistor including a gate insulating film, source/drain regions and a channel located directly under the gate electrode. The gate insulating film of the transistor having the higher operation voltage is thicker than the gate insulating film of the transistor having the lower operation voltage. Each transistor includes an LDD region subject to the LDD implantation, the oxidation process causing thermal diffusion of the LDD regions in the transistor having a higher threshold voltage so that a junction depth of the LDD regions deepen. Each transistor can include an LDD region subject to said LDD implantation, the oxidation process causing thermal diffusion of LDD regions in the transistor having a higher operation voltage so as to ensure a smooth transition between the LDD region and adjacent n-impurity or p-impurity regions.

In the invention, in part, the transistors further comprise PMOS and NMOS transistors, at least one high-voltage and low-voltage PMOS transistor, and at least one high-voltage and low-voltage NMOS transistor. The threshold voltage values of the transistors are adjusted by using a mask to implant p impurities into an NMOS region of the NMOS transistors, and n impurities into a PMOS region of PMOS transistors so as to form a channel in each transistor. Also, the p impurities comprise at least one of boron or indium and the n impurities comprise at least one of phosphorous, arsenic, or antimony. The gate electrode comprises poly-Si or amorphous-Si, and the oxidation process is carried out at a temperature of about 800–1100° C.

The invention, in part, pertains to a semiconductor device having a substrate, a gate electrode formed over the substrate, and at least two transistors having different threshold voltages provided over the substrate, each transistor being subject to LDD implantation, the transistor having a higher threshold voltage being subject to the LDD implantation prior to being subject to an oxidation process that thermally diffuses the LDD dopant implanted therein.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, wherein like elements are represented by like reference numerals, which are given by way of illustration only and thus are not limitative of the present invention and wherein.

DETAILED DESCRIPTION

The invention provides a semiconductor device having low-voltage/high-voltage transistors and a method for forming low-voltage/high-voltage transistors of semiconductor devices for use in large scale integrated circuits (LSI), for example. In the method, and preferably on an LSI where at least one low-voltage transistor is intermingled with a high-voltage transistor, a low-density doping (LDD) implantation of the high-voltage transistor is conducted. Then, a protective oxide film for the LDD implantation of the low-voltage transistor is formed using a suitable oxidation process such as thermal oxidation or thermal chemical vapor deposition (CVD). Thereafter, LDD implantation of the low-voltage transistor is conducted.

With the method of the invention, a deep junction is obtained in the LDD region of the high-voltage transistor because, after LDD implantation, the oxidation process (thermal oxidation/thermal CVD) is applied, causing any impurities to diffuse. Moreover, any generation of hot carriers near the drain region is suppressed because the LDD junction is smooth and deep. A smooth LDD junction relaxes the electrical field density near the drain. Also, a deep LDD junction prevents the concentration of current pass at interface channel and gate oxide. What results is a structure that is substantially impervious to deterioration in transistor characteristics.

Moreover, since an oxidation or thermal process is not applied in the LDD region of the low-voltage transistor, the low-voltage transistor has a shallow LDD region, making it difficult for any short channel effects to occur. With this method, characteristics for both the low-voltage and high-voltage transistors may be optimized. That is, high-voltage transistors have deep and smooth LDD junctions, resulting in good hot carrier immunity. Low-voltage transistors have shallow and high dosed LDD junctions to thereby ensure good short channel immunity with high performance.

Figure 1:
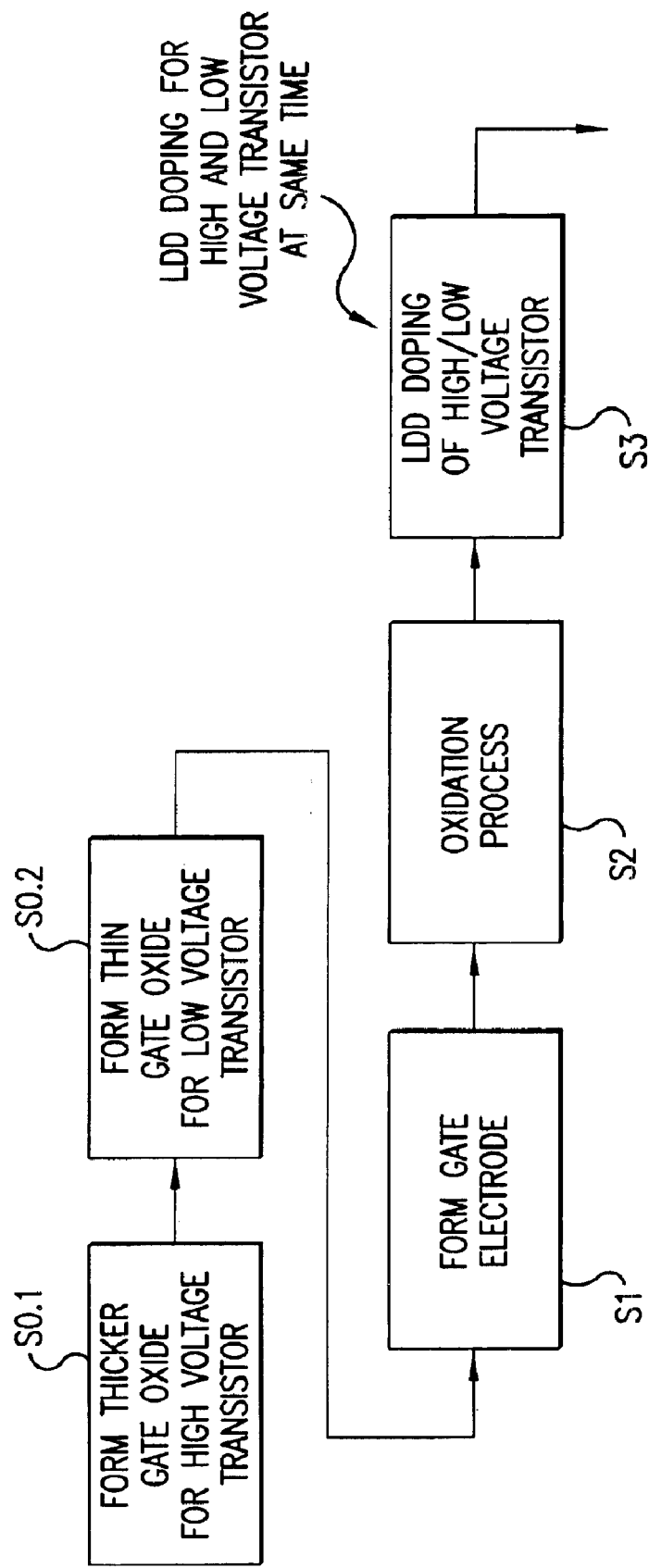
FIG. 1 illustrates a general method of forming a conventional semiconductor device.
Figure 2:
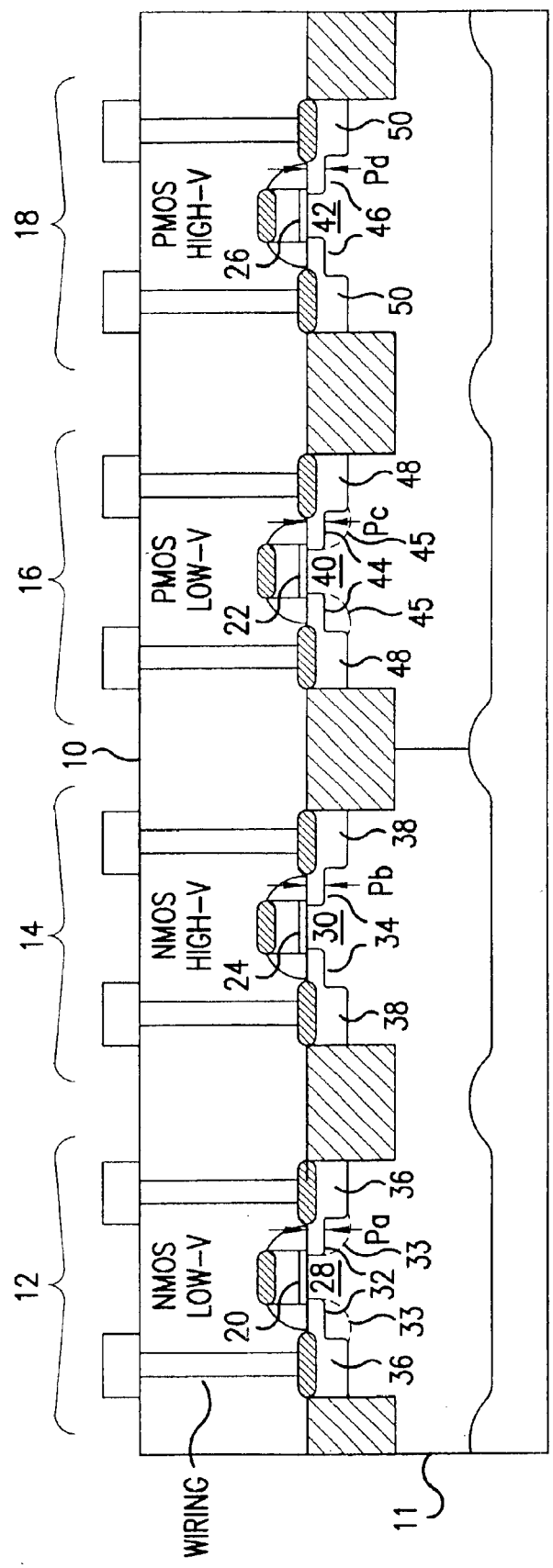
FIG. 2 illustrates an exemplary semiconductor device formed using a preferred embodiment of the invention.

FIG. 2 is a cross-sectional view illustrating a semiconductor device 10 having at least one high voltage transistor and one low-voltage transistor provided on a single chip. This semiconductor device 10 is an exemplary device formed according to a preferred embodiment of the invention.

The semiconductor device 10 comprises n-channel MOS (NMOS) transistors 12 and 14 and p-channel MOS (PMOS) transistors 16 and 18. The NMOS transistor 12 and the PMOS transistor 16 are low voltage transistors that are driven at a given low voltage, e.g., an operation voltage of about 1.8 volts. In contrast, the NMOS transistor 14 and the PMOS transistor 18 are high voltage transistors that are driven at a high voltage, e.g., an operation voltage of about 3.3 volts.

The NMOS transistor 12 and the PMOS transistor 16 driven at the low operating voltage are used for a portion of circuitry that exchanges signals within the semiconductor device 10, such as a logic circuit. The low voltage MOS transistors 12 and 14 have thin-film gate oxide films 20 and 22 respectively.

In contrast, high-voltage NMOS transistor 14 and PMOS transistor 18 are typically used for a portion of the interface between the semiconductor device 10 and an external circuit. The high voltage MOS transistors 14 and 18 have thick-film gate oxide films 24 and 26 respectively.

A p-type channel region 28 is formed below the NMOS transistor 12, and a p-type channel region 30 is formed below the NMOS transistor 14. N-type lightly doped drain regions (LDD) 32 and n-type source/drain (S/D) regions 36 are formed on each side of the channel region 28, and n-type LDD regions 34 and n-type source/drain regions 38 are formed on each side of the channel region 30. The LDD regions 32 and 34 are formed so as to be lower in impurity concentration than the source/drain regions 36 and 38.

An n-type channel region 40 is formed below the PMOS transistor 16, and an n-type channel region 42 is formed below the PMOS transistor 18. P-type LDD regions 44 and p-type source/drain regions 48 are formed on each side of the channel region 40, and p-type LDD regions 46 and p-type source/drain regions 50 are formed on each side of the channel region 42. The LDD regions 44 and 46 are formed so as to be lower in impurity concentration than the source/drain regions 48 and 50.

In FIG. 2, reference symbol Pa represents a junction depth profile of LDD region 32; Pb represents a junction depth profile of LDD region 34; Pc represents a junction depth profile of LDD region 44; and Pd represents a junction depth profile of LDD region 46. As shown in FIG. 2, in the semiconductor device 10 in accordance with the invention, the high-voltage transistors 14 and 18 have deeper junction depth profiles in the LDD regions than the low-voltage transistors 12 and 16 (i.e., Pa<Pb, and Pc<Pd).

Figure 3:
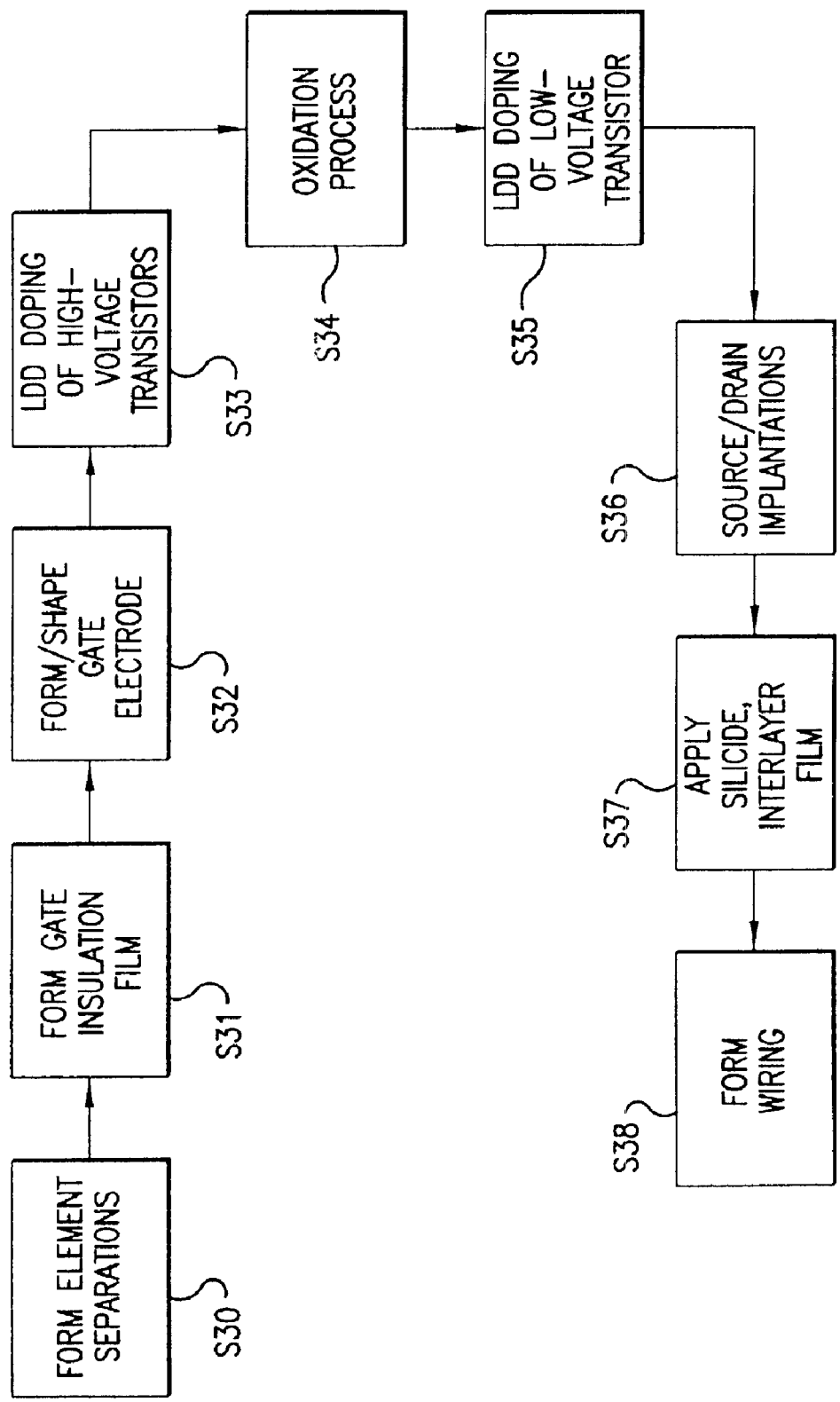
FIG. 3 is a diagram illustrating the method in accordance with the invention.

FIG. 3 is a flow diagram illustrating the method of the invention. Referring to FIG. 3, in step S30 element separations are formed on a semiconductor substrate using STI (shallow trench isolation) or the like. In step S30, a well is formed and the threshold voltage value of the transistor(s) is adjusted by using a mask made of photo-resist, for example, to implant p-type impurities into the NMOS region of NMOS transistors 12 and 14, and n-type impurities into the PMOS region of PMOS transistors 16 and 18. These form the p-type channel regions 28 and 30 and the n-type channel regions 40 and 42 of FIG. 2. Since the threshold voltage value of the low-voltage transistors 12 and 16 and the high-voltage transistors 14 and 18 are each respectively adjusted, it is also acceptable to use a mask to further implant separately.

Next, a gate insulation film is formed in Step S31, and the gate oxide film of only the high-voltage transistor is applied, so as to be thicker than the gate oxide film of the low-voltage transistor. This application also may be done using a known masking technique or the like.

Then, in Step S32 poly-Si is deposited as a gate electrode for each transistor and the gate electrode for each transistor is processed into the desired shape. Thereafter, a dopant of n-type impurities, such as phosphorous at an energy of about 20 keV and a dose of about $6 \times 10^{13}/cm^2$ for example, are implanted in a step S33 into the LDD region 34 of only the high-voltage NMOS transistor 14, and a dopant of p-type impurities (e.g., $BF_2$ at energy of about 20 keV and dose of about $6 \times 10^{13}/cm^2$) are implanted into the LDD region 46 of only the high-voltage PMOS transistor 18.

In Step S34 the oxidation process is performed. An oxide film approximately 3 to 7 nm in thickness is formed on the poly-Si surface over each of the transistors 12, 14, 16 and 18 as well as the silicon substrate surface 11, using an oxidation process at approximately 800 to 1100° C. The oxidation step advantageously dopes the high-voltage transistors, because the thermal diffusing of the dopant by oxidation (implanted in the previous step) causes a deeper LDD region junction to be formed, as illustrated in FIG. 2. Moreover, the thermal diffusing of the dopant in the oxidation step ensures that there is a smooth transition between n-type and p-type regions within each transistor, which enhances transistor reliability. The resulting smooth junction relaxes electrical field density near drain, which suppress generation of hot carrier.

Thereafter, in Step S35, a dopant of n-type impurities (e.g., arsenic at energy of about 5 keV and dose of about $1 \times 10^{15}/cm^2$) are implanted into the LDD region 32 and a dopant of p-type impurities (e.g., boron at energy of about 15 keV and a dose of about $3 \times 10^{13}/cm^2$ with 20 degrees tilt) are implanted into the pocket region 33 of only the low-voltage NMOS transistor 12 and a dopant of p-type impurities (e.g., boron at an energy of about 2 keV and a dose of about $3 \times 10^{14}/cm^2$) are implanted into the LDD region 44, and a dopant of n-type impurities (e.g., phosphorus at an energy of about 45 keV and a dose of about $5 \times 10^{13}/cm^2$ with 25 degrees tilt) are implanted into the pocket region 45 of low-voltage PMOS transistor 16. After forming a gate spacer (not shown), source and drain implantations for the source and drain regions 36, 38, 48 and 50 of the NMOS and PMOS transistors are conducted (Step S36), followed by the application of a silicide interlayer film (step S37). Finally, wiring formation processes (Step S38) are conducted to form wire pairs for connection to the surface of the semiconductor device 10 for each transistor.

As described above, the method of the present invention provides a semiconductor device having both high-voltage and low-voltage transistors with increased reliability, where both may be manufactured without reducing the reliability of the high-voltage transistor or performance of the low-voltage transistor. Moreover, oxidation after LDD doping of the high-voltage transistor enables diffusion to create a deeper LDD region junction, while the protective oxide film allows the low-voltage transistor to maintain a relatively shallow LDD junction depth to optimize performance and reliability.

Therefore, the present invention inserts a thermal process such as oxidation between the LDD step for the high-voltage transistor and the LDD step for the low-voltage transistor. As a result, the impurities in the LDD region of the high-voltage transistor undergo thermal diffusion, thus causing the junction at the LDD/source region of LDD/channel or LDD/drain region to be smooth and the electric field in the vicinity of the drain region to be eased. As for the low-voltage transistor, since no thermal process is conducted, the LDD region structure is of a shallow depth so that transistor performance can be maintained.

The invention being thus described, it will be obvious that the same may be varied in many ways. The above-described method has been described as comprised of several components, flowcharts or blocks, it should be understood that the method or manufacturing the semiconductor device may be implemented by application specific integrated circuits, software-driven processor circuitry, or other arrangements of discrete components. Such variations are not to be regarded as a departure from the spirit and scope of the invention, and all such modifications as would be obvious to one skilled in the art are intended to be included within the scope of the following claims.

What is claimed is:

1. A semiconductor device, comprising:
   a substrate; and
   at least two transistors each having different threshold voltages provided over the substrate, wherein each transistor includes LDD regions and a gate electrode, at least one of said transistors having a higher threshold voltage and at least one of said transistors having a lower threshold voltage, and the LDD regions of the at least one highest threshold voltage transistor have a deeper junction depth than the LDD regions of the at least one lowest threshold voltage transistor.

2. The semiconductor device of claim 1, wherein each transistor further includes a gate insulating film, source/drain regions and a channel located directly under the gate electrode.

3. The semiconductor device of claim 2, wherein the gate insulating film of the transistor having the higher operation voltage is thicker than the gate insulating film of the transistor having a lower operation voltage.

4. The semiconductor device of claim 1, wherein thermal diffusion caused by oxidation ensures a smooth transition between the LDD region and adjacent n-impurity or p-impurity regions of the highest threshold voltage transistor.

5. The semiconductor device of claim 1, wherein said at least two transistors further comprise PMOS and NMOS transistors, at least one high-voltage and low-voltage PMOS transistor, and at least one high-voltage and low-voltage NNOS transistor.

6. The semiconductor device of claim 5, wherein threshold voltage values of the transistors are adjusted by using a mask to implant p impurities into an NMOS region of the NMOS transistors, and n impurities into a PMOS region of PMOS transistors so as to form a channel in each transistor.

7. The semiconductor device of claim 6, wherein the p impurities comprise at least one of boron or indium and the n impurities comprise at least one of phosphorous, arsenic, or antimony.

8. The semiconductor device of claim 1, wherein the gate electrodes of each transistor comprise poly-Si or amorphous-Si.

9. The semiconductor device of claim 1, wherein said transistors are oxidized subsequent to formation of said LDD regions of the at least one highest threshold voltage transistor to form an oxide layer thereon.

10. The semiconductor device of claim 9, wherein said LDD regions of the at least one lowest threshold voltage transistor are formed after forming said oxide layer.

* * * * *